(12) United States Patent
Nakamura et al.

(10) Patent No.: US 11,349,476 B2
(45) Date of Patent: May 31, 2022

(54) HIGH-VOLTAGE AMPLIFIER, HIGH-VOLTAGE POWER SUPPLY, AND MASS SPECTROMETER

(71) Applicant: Hitachi High-Tech Corporation, Tokyo (JP)

(72) Inventors: Yuki Nakamura, Tokyo (JP); Takuma Nishimoto, Tokyo (JP); Hiroshi Touda, Tokyo (JP); Isao Furuya, Tokyo (JP); Suguru Kondo, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 92 days.

(21) Appl. No.: 16/977,940

(22) PCT Filed: Dec. 26, 2018

(86) PCT No.: PCT/JP2018/047725
§ 371 (c)(1),
(2) Date: Sep. 3, 2020

(87) PCT Pub. No.: WO2019/187431
PCT Pub. Date: Oct. 3, 2019

(65) Prior Publication Data
US 2021/0044293 A1 Feb. 11, 2021

(30) Foreign Application Priority Data
Mar. 30, 2018 (JP) .............................. JP2018-067795

(51) Int. Cl.
*H03K 17/687* (2006.01)
*H01J 49/02* (2006.01)

(52) U.S. Cl.
CPC .......... *H03K 17/687* (2013.01); *H01J 49/022* (2013.01); *H01J 49/025* (2013.01); *H03K 17/6872* (2013.01); *H03K 17/6874* (2013.01)

(58) Field of Classification Search
CPC ............. H03K 17/687; H03K 17/6872; H03K 17/6874; H01J 49/022; H01J 49/025
See application file for complete search history.

(56) References Cited

U.S. PATENT DOCUMENTS 6,014,060 A * 1/2000 Nojiri ................... H03F 1/0244
330/297
2019/0158027 A1 * 5/2019 Williams .............. H03F 3/2171

FOREIGN PATENT DOCUMENTS

CN 202652646 U 1/2013
JP 11259153 A * 9/1999
(Continued)

OTHER PUBLICATIONS

Notice of Submission of Publication dated Sep. 28, 2021 in Japanese Application No. 2020-509658.
(Continued)

*Primary Examiner* — David E Smith
(74) *Attorney, Agent, or Firm* — Miles & Stockbridge, P.C.

(57) ABSTRACT

A positive high voltage, a first terminal of a semiconductor element, and a first terminal of a first resistance element are connected to a first terminal of a first current controller. A current input terminal of a first active element is connected to a second terminal of the first current controller, and a second terminal of the semiconductor element and a second terminal of the first resistance element are connected to a control terminal of the first active element. A second resistance element is connected between a current output terminal and a control terminal of the first active element. The first current controller allows a drive current corresponding to an input signal to flow in the first active element and allows the drive current output from the first active element to flow into a load, thereby generating an output voltage.

11 Claims, 4 Drawing Sheets

(56) References Cited

FOREIGN PATENT DOCUMENTS

| | | |
|---|---|---|
| JP | H11259153 A | 9/1999 |
| JP | 2012109738 A | 6/2012 |
| JP | 2019097165 A | 6/2019 |

OTHER PUBLICATIONS

Written Opinion dated Mar. 19, 2019 in corresponding International Application No. PCT/JP2018/047725.
Search Report dated Mar. 19, 2019 in corresponding International Application No. PCT/JP2018/047725.

* cited by examiner

[FIG. 1]
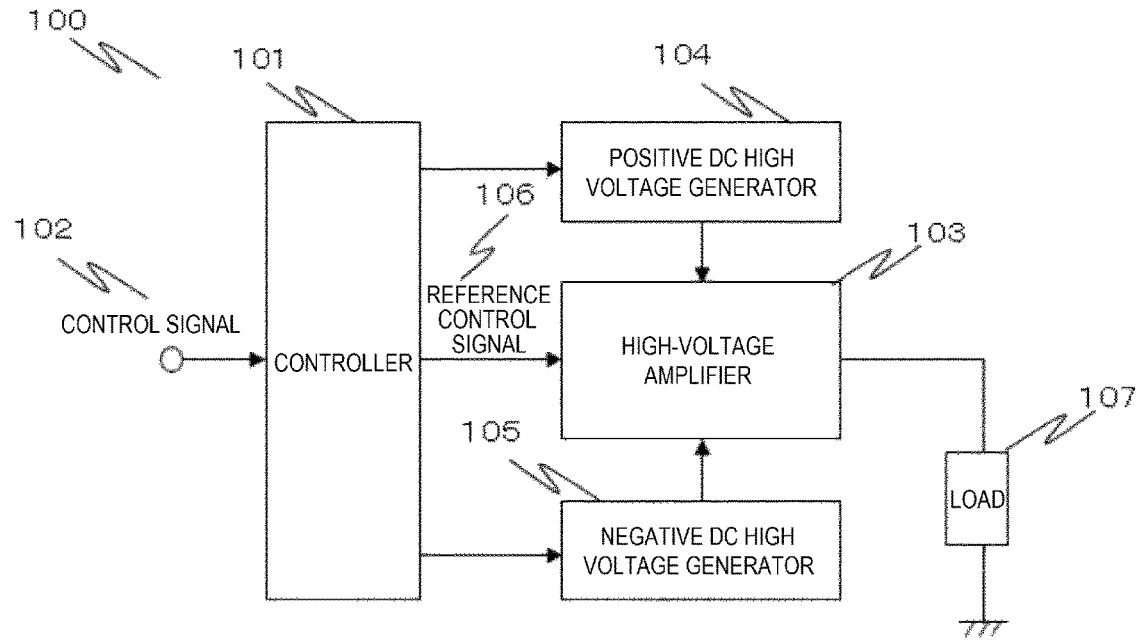
[FIG. 2]
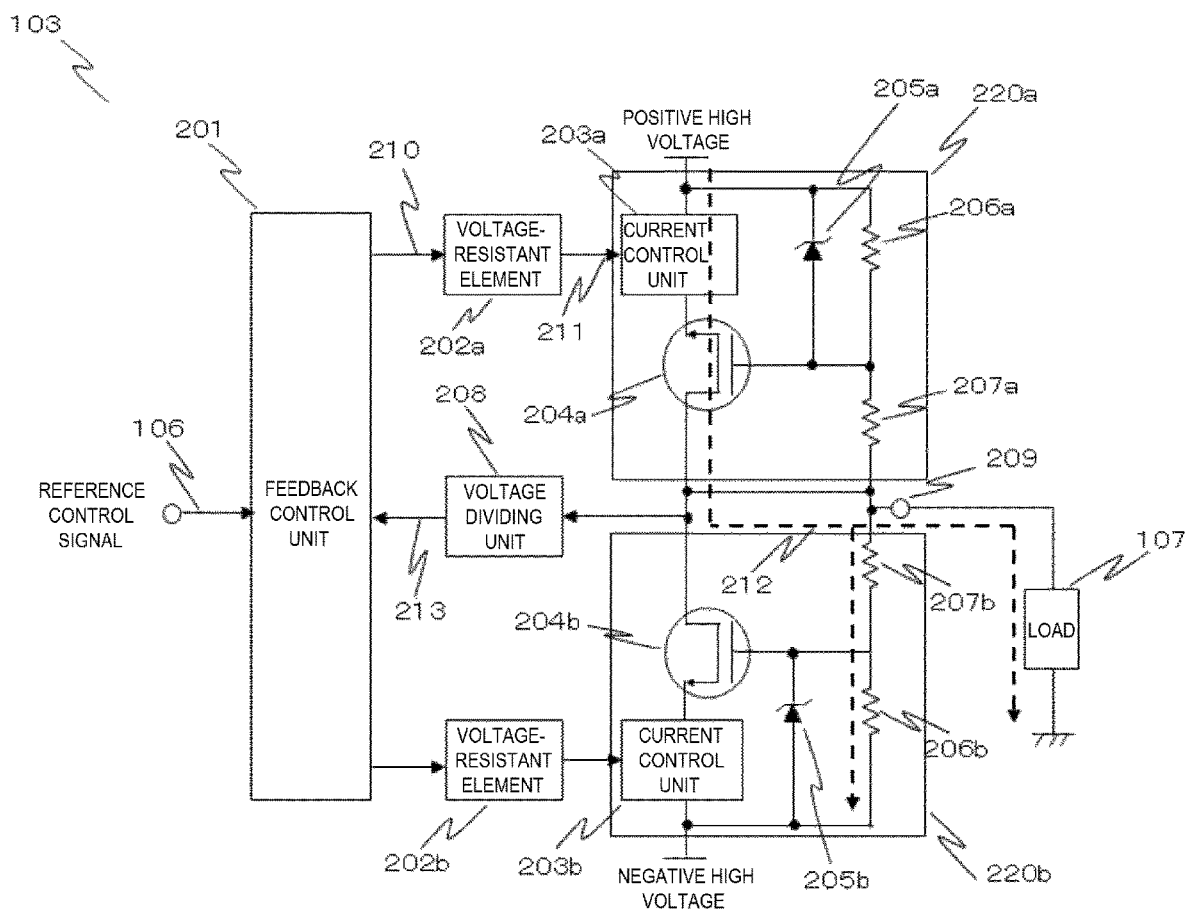

[FIG. 3]
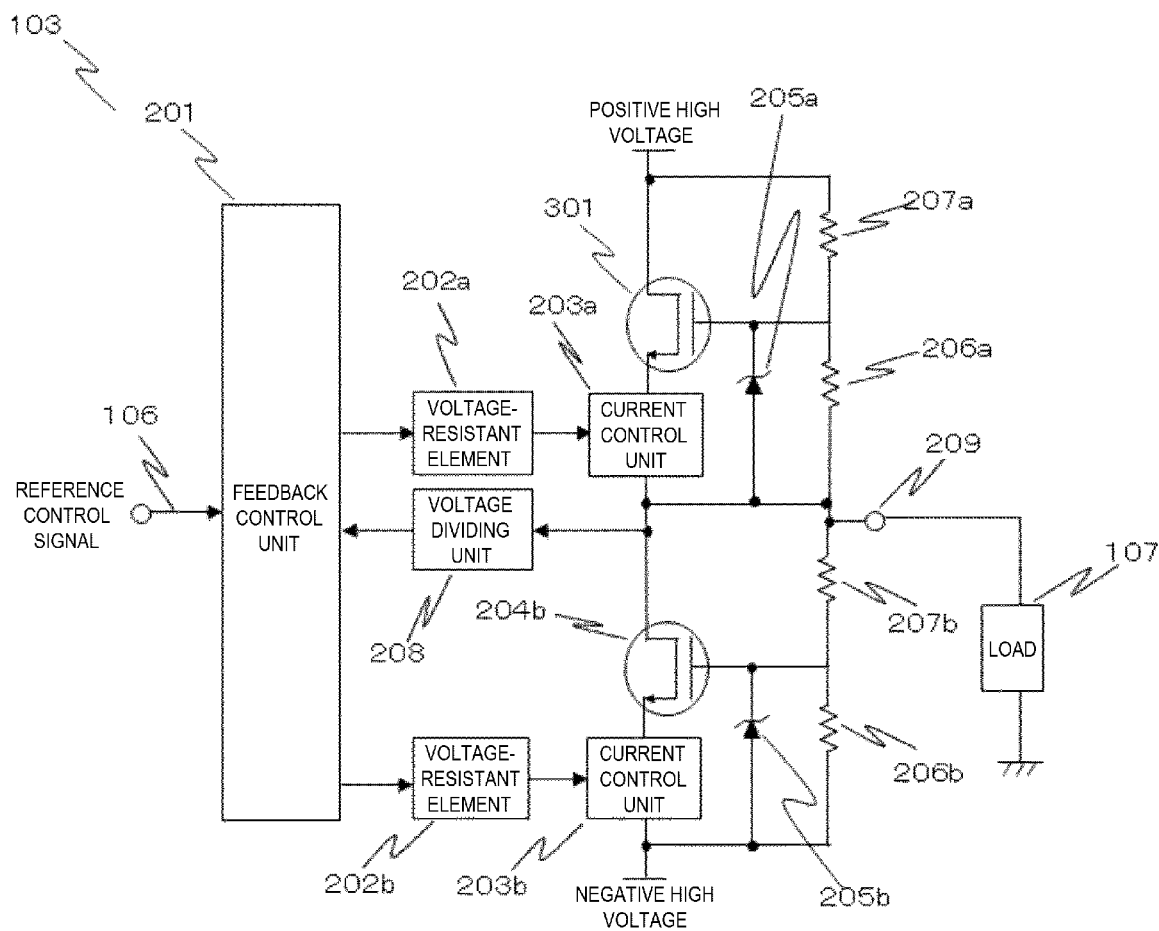

[FIG. 4]
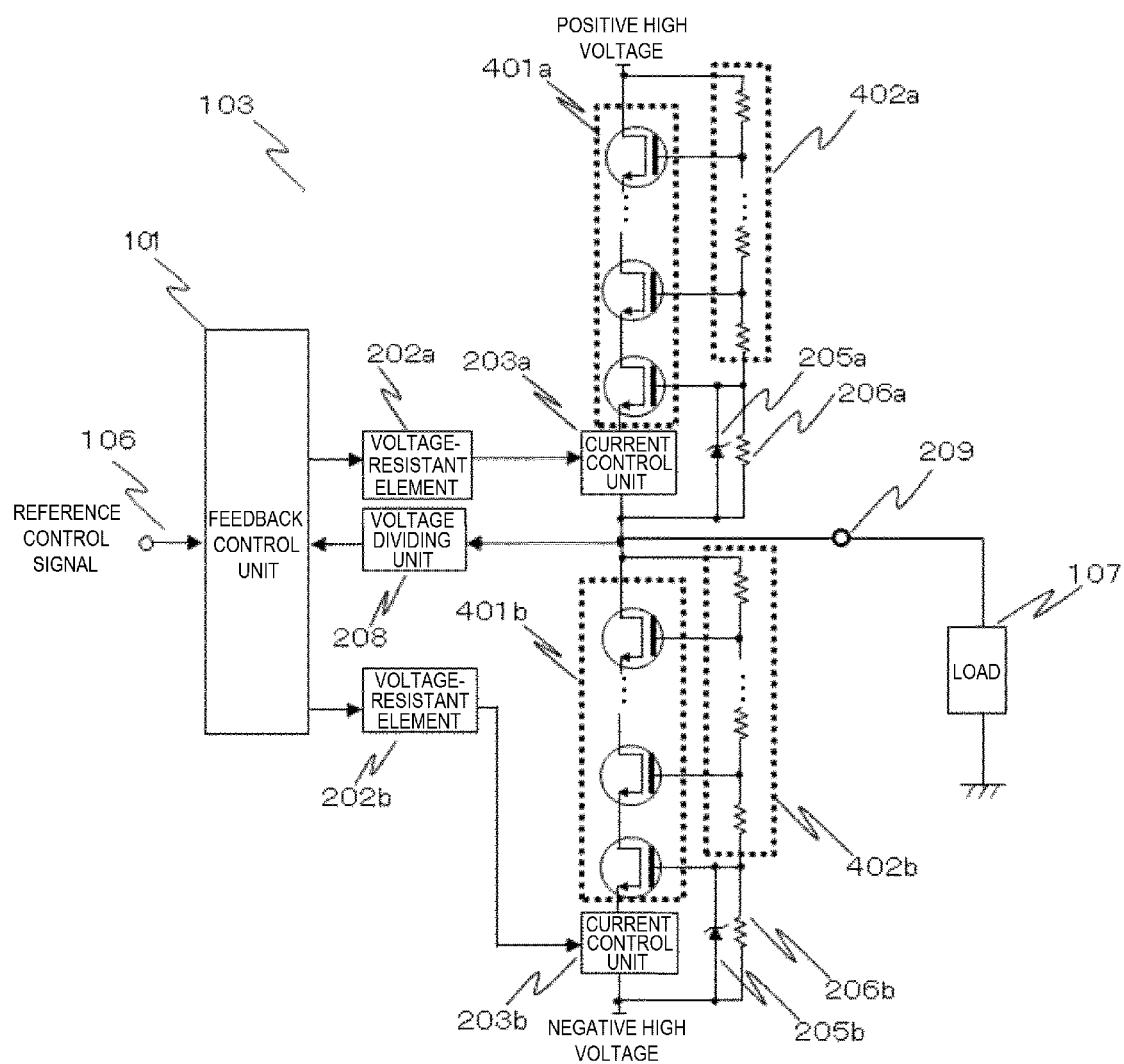

[FIG. 5]
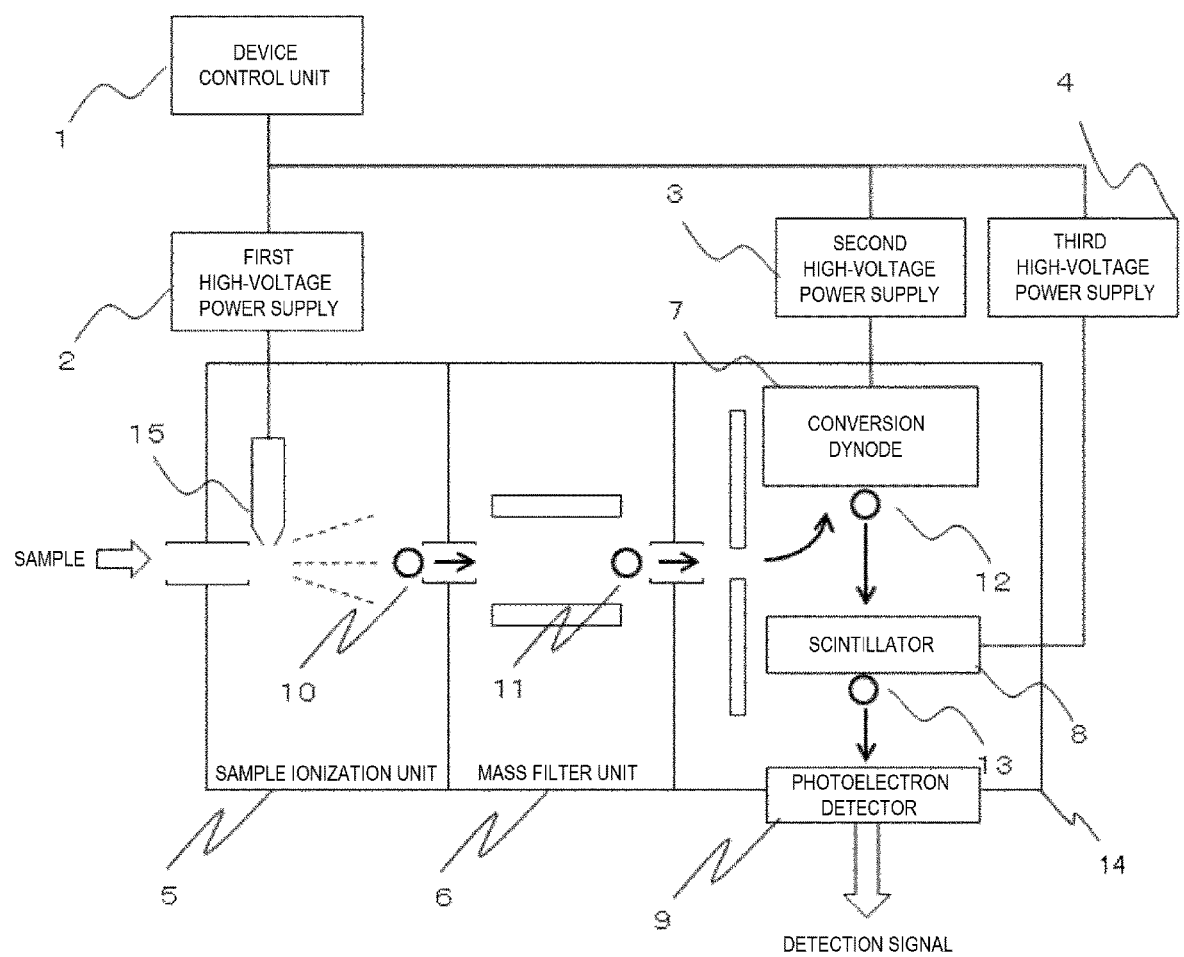

HIGH-VOLTAGE AMPLIFIER, HIGH-VOLTAGE POWER SUPPLY, AND MASS SPECTROMETER

TECHNICAL FIELD

The present invention relates to a high-voltage amplifier, a high-voltage power supply, and a mass spectrometer.

BACKGROUND ART

There has been a high-voltage amplifier that controls a high voltage of several kV or more based on a control signal of several volts to several tens of volts, and a high-voltage power supply using the high-voltage amplifier. Such a high-voltage power supply is used, for example, in an ion source, a conversion dynode, or the like used in a mass spectrometer.

Such a high-voltage power supply is described in, for example, PTLs 1 and 2. In the high-voltage power supplies described in PTLs 1 and 2, high breakdown voltage transistors are used as active elements that control an output voltage, and these active elements are controlled from a low voltage side.

Specifically, in the high-voltage power supply of PTL 1, an insulated DC/DC converter is used. Since an output impedance of the isolated DC/DC converter is low, a voltage applied to a control circuit can be transitioned at a high rate. The control circuit controls transient characteristics of the input voltage that transitions at a high rate, and outputs the voltage to a control terminal of the active element. By appropriately setting such transient characteristics, it is possible to control ON or OFF of the active element at a high rate.

The high-voltage power supply of PTL 2 includes two or more stages of FETs connected between DC power supplies, a photocoupler for current control of the FETs, and an operational amplifier that controls the photocoupler. Further, a controlled voltage can be freely selected from a positive power supply, both positive and negative power supplies, and a negative power supply. At this time, a reference voltage of the current control is generated by a photovoltaic circuit.

CITATION LIST

Patent Literature

PTL 1: JP-A-2012-109738
PTL 2: JP-A-11-259153

SUMMARY OF INVENTION

Technical Problem

In the high-voltage power supplies of PTLs 1 and 2, the high breakdown voltage transistors are used as active elements that control the output voltage, and the active elements are controlled from the low voltage side. Therefore, an electrically isolated drive needs to be performed, which requires a high breakage voltage insulating component such as an insulated DC/DC converter or a photovoltaic circuit. For this reason, PTLs 1 and 2 lead to increase in cost and size of the high-voltage power supply.

An object of the invention is to provide a low-cost and compact high-voltage power supply by omitting a high breakage voltage insulating component.

Solution to Problem

A high-voltage amplifier according to an aspect of the invention is a high-voltage amplifier comprising a drive unit. The drive unit includes: a first current control unit including a first terminal and a second terminal; a first active element including a current inflow terminal, a current outflow terminal, and a control terminal; a semiconductor element including a first terminal and a second terminal; a first resistance element including a first terminal and a second terminal; and a second resistance element connected to the first resistance element. The first terminal of the first current control unit is connected to a positive high voltage, the first terminal of the semiconductor element, and the first terminal of the first resistance element. The current inflow terminal of the first active element is connected to the second terminal of the first current control unit. The second terminal of the semiconductor element and the second terminal of the first resistance element are connected to the control terminal of the first active element. The second resistance element is connected between the current outflow terminal and the control terminal of the first active element. The first current control unit is configured to cause a drive current corresponding to an input signal to flow into the first active element, and cause a drive current output from the first active element to flow into a load, so as to generate an output voltage.

A high-voltage power supply according to an aspect of the invention further includes: a controller configured to apply a reference control signal to the high-voltage amplifier; and a positive high voltage generator configured to generate the positive high voltage.

A mass spectrometer according to an aspect of the invention is amass spectrometer configured to analyze a sample solution eluted from a liquid chromatograph, and includes: a sample ionization unit including an ion source; and an ion detection unit including a conversion dynode and a scintillator. The high-voltage power supply is connected to at least one of the ion source, the conversion dynode, and the scintillator.

Advantageous Effect

According to the aspect of the invention, it is possible to provide a low-cost and compact high-voltage power supply by omitting a high breakage voltage insulating component.

BRIEF DESCRIPTION OF DRAWINGS

FIG. 1 is a diagram showing a configuration of a high-voltage power supply according to Embodiment 1.
FIG. 2 is a diagram showing a configuration of a high-voltage amplifier according to Embodiment 1.
FIG. 3 is a diagram showing a configuration of a high-voltage amplifier according to Embodiment 2.
FIG. 4 is a diagram showing a configuration of a high-voltage amplifier according to Embodiment 3.
FIG. 5 is a diagram showing a configuration of a mass spectrometer according to Embodiment 4.

DESCRIPTION OF EMBODIMENTS

Hereinafter, embodiments will be described with reference to the drawings.

Embodiment 1

A high-voltage power supply according to Embodiment 1 will be described with reference to FIGS. 1 and 2.

As shown in FIG. 1, a high voltage power supply 100 includes a controller 101, a high-voltage amplifier 103, a positive DC high voltage generator 104, a negative DC high voltage generator 105, and a load 107.

Next, operations of the high-voltage power supply 100 will be described.

The controller 101 generates a reference control signal 106 for controlling the positive DC high voltage generator 104, the negative DC high voltage generator 105, and the high-voltage amplifier 103 based on a control signal 102 necessary for controlling an output high voltage of the high-voltage power supply 100 from an external controller (not shown). Here, the external controller is a main PC or the like of a device on which the high-voltage power supply 100 is mounted. The positive DC high voltage generator 104 and the negative DC high voltage generator 105 generate a high voltage (for example, + several kV and − several kV) based on a control signal of a low voltage (for example, several volts to several tens of volts) input from the controller 101, and applies the high voltage to the high-voltage amplifier 103. The controller 101 is, for example, a circuit obtained by combining an arithmetic unit, a memory, and an operational amplifier, or a device including the circuit.

The high-voltage amplifier 103 operates at the applied high voltage, amplifies the signal of the reference control signal 102 input from the controller 101, and applies the amplified signal to the load 107. For example, an amplification factor of the high-voltage amplifier 103 is several hundred to several thousand times, and the reference control signal 106 of several volts to several tens of volts is amplified to a high voltage of several kV. Here, the load 107 is a load that requires a high voltage application in a device on which the high-voltage power supply 100 is mounted, and is, for example, an electrode.

The high-voltage amplifier 103 of Embodiment 1 will be described with reference to FIG. 2.

As shown in FIG. 2, the high-voltage amplifier 103 includes a feedback control unit 201, voltage-resistant elements 202a and 202b, current control units 203a and 203b, active elements 204a and 204b, semiconductor elements 205a and 205b, resistant element As 206a and 206b, resistant element Bs 207a and 207b, a voltage dividing unit 208, and a high-voltage output terminal 209. One example of the current control units 203a and 203b is a bipolar transistor.

Here, the positive high voltage of FIG. 2 is a high voltage output by the positive DC high voltage generator 104, and the negative high voltage is a high voltage output by the negative DC high voltage generator 105. The active element 204a and the active element 204b have opposite operating polarities. The active element 204a is configured with, for example, a P-type MOSFET, and the active element 204b is configured with, for example, an N-type MOSFET or a transistor represented by bipolar transistor or IGBT.

Next, operations of the high-voltage amplifier 103 will be described separately in two steps.

A first step is a case of an initial state of 0 V where the control signal is still not input to the reference control signal 106 after the positive and negative high voltages are applied from the positive DC high voltage generator 104 and the negative DC high voltage generator 105 to the high-voltage amplifier 103. When the high voltages on the positive side and the negative side are applied, a current flows through the resistance element As 206a and 206b, the resistance element Bs 207a and 207b, and the semiconductor elements 205a and 205b. The current flows from the positive DC high voltage generator 104 toward the positive DC high voltage generator 105, and a voltage is generated by the current between the terminals of the resistance element As 206a and 206b, the resistance element Bs 207a and 207b, and the semiconductor elements 205a and 205b.

Here, the semiconductor elements 205a and 205b are elements that generate a fixed voltage when a current of certain amount or more flows, and are, for example, a Zener diode, or a diode connection of a transistor, or a constant voltage circuit. The voltage generated by the semiconductor elements 205a and 205b may be equal to or higher than a total operating voltage of the active elements 204a and 204b and the current control units 203a and 203b, and is, for example, several volts to several tens of volts.

Since the semiconductor elements 205a and 205b generate the voltage based on the positive high voltage and the negative high voltage, the current control unit 203a is floated to the positive high voltage and the current control unit 203b is floated to the negative high voltage. When a voltage necessary for operation is supplied from the semiconductor elements 205a and 205b, the current control units 203a and 203b apply a current to the active elements 204a and 204b based on control signals 211 of the current control units 203a and 203b input from the voltage-resistant elements 202a and 202b.

For example, the current control unit 203a supplies several times to several thousand times of the current value of the input control signal 211 to the active element 204a. The voltage-resistant element 202a generates the control signal 211 of the current control unit 203a based on the control signal 210 input from the feedback control unit 201 operating at a low voltage. Here, since the current control unit 203a is floated to the positive side high voltage, the voltage-resistant element 202a is required to be an insulating element having a high breakage voltage equal to or higher than the positive high voltage. Examples thereof include a photocoupler, an insulating transformer, and the like.

The active element 204a causes the current flowing in from the current control unit 203a to flow out to the connected active element 204b, resistance element B 207b, and load 107. Further, the active element 204b causes the current flowing out from the current control unit 203b to flow in from the connected active element 204a, resistance element B 207b, and load 107. A difference between an inflow amount and an outflow amount of the current determines the voltage of the high-voltage output terminal 209. The voltage dividing unit 208 supplies to the feedback control unit 201 a feedback signal 213 obtained by dividing the voltage of the high-voltage output terminal 209. The period control unit 201 is, for example, a circuit using an operational amplifier.

For example, a voltage division ratio is a reciprocal of several hundred to several thousand, which is a reciprocal of the amplification factor of the high-voltage amplifier 103. The feedback control unit 201 compares the input feedback signal 213 with the reference control signal 106. In the initial state, since the reference control signal 106 is 0 V, the feedback control unit 201 compares the feedback signal 213 with 0 V. When the feedback signal 213 is lower than 0 V, by increasing a control amount of the voltage-resistant element 202a and decreasing a control amount of the voltage-resistant element 202b, a current amount flowing out from the high voltage output terminal 209 is decreased, and a current amount flowing in is increased. As a result, the voltage of the high-voltage output terminal 209 is increased.

When the feedback signal 213 is higher than 0 V, by decreasing the control amount of the voltage-resistant element 202a and increasing the control amount of the voltage-resistant element 202b, the current amount flowing out from the voltage-resistant output terminal 209 is increased, and the current amount flowing in is decreased. As a result, the voltage of the high-voltage terminal 209 is decreased. Due to this series of operations, the voltage of the high-voltage output terminal 209 becomes 0 V, which is the same as the reference control signal 106. Due to the operation of the first step, the voltage of the high voltage output terminal 209 is stabilized to 0 V.

In FIG. 2, the elements on a positive electrode side (the voltage-resistant element 202a, the current control unit 203a, the active element 204a, the semiconductor element 205a, the resistant element A 206a, and the resistant element B 207a) and the elements on a negative electrode side (the voltage-resistant element 202b, the current control unit 203b, the active element 204b, the semiconductor element 205b, the resistance element A 206b, and the resistance element B 207b) are symmetrically arranged. However, the elements actually do not have exactly the same characteristics due to variations in the elements, and deviation occurs therebetween. That is, the operation of the first step makes it possible to accurately set the high voltage output terminal 209 to 0 V even when a variation is present in the characteristics of the constituent elements.

Next, the following describes a second step of controlling the voltage of the high voltage output terminal 209 by changing the reference control signal 106 after the voltage of the high voltage output terminal 209 becomes 0 V.

The high-voltage amplifier 103 outputs 0 V in the first step, and control amounts and current values necessary for the high-voltage output terminal 209 to become 0 V are maintained in the voltage-resistant elements 202a and 202b, the current control units 203a and 203b, and the active elements 204a and 204b. The following discusses increasing the reference control signal 106 to increase the voltage of the high-voltage output terminal 209 in this state.

When the reference control signal 106 is increased and becomes larger than the voltage of the feedback signal 213, the feedback controller 201 increases the control amount of the voltage-resistant element 202a and decreases the control amount of the voltage-resistant element 202b. As a result, the current flowing into the high voltage output terminal 209 is increased, and the current flowing out is decreased (in FIG. 2, a flow of the current flowing in is referred to as a high-voltage drive current 212).

As a result, the voltage of the high-voltage output terminal 209 is increased. The voltage dividing unit 208 supplies to the feedback control unit 201 the feedback signal 213 obtained by dividing the voltage of the high-voltage output terminal 209, and the feedback control unit 201 ends adjustment of the control amount when the reference control signal 106 and the feedback signal 213 are equal. This operation is similar to that in the case where the reference control signal 106 is decreased. Due to this series of operations, the voltage of the high voltage output terminal 209 becomes a voltage obtained by multiplying the reference control signal by a value of the reciprocal of the voltage division ratio of the voltage dividing unit 208.

As described above, in the high-voltage power supply of Embodiment 1, only the voltage-resistant elements 202a and 202b for transmitting the control signal are used without requiring other voltage-resistant elements for transmitting power or the reference voltage. As a result, it is possible to provide a low-cost and compact high-voltage power supply.

Embodiment 2

In Embodiment 1, the active elements having polarities opposite to each other, including P-type and N-type, are used as the active elements, whereas an N-type MOSFET generally has a higher breakage voltage compared to a P-type one. Therefore, in Embodiment 2, by configuring the active elements only with N-type ones, it is possible to handle a higher voltage.

The high-voltage amplifier 103 of Embodiment 2 will be described with reference to FIG. 3.

The high-voltage amplifier 103 includes the feedback control unit 201, the voltage-resistant elements 202a and 202b, the current control units 203a and 203b, an active element 301 and the active element 204b, the semiconductor elements 205a and 205b, the resistant element As 206a and 206b, the resistant element Bs 207a and 207b, the voltage dividing unit 208, and the high-voltage output terminal 209. Here, the active element 301 and the active element 204b are active elements having the same operating polarity, and are N-type MOSFETs.

The current control unit 203a, the semiconductor element 205a, and the resistance element A 206a are connected to the high voltage output terminal 209, and the elements operate while floating at the voltage of the high voltage output terminal 209. That is, in Embodiment 2, a reference voltage at which the elements float is different from that of Embodiment 1.

However, as described in Embodiment 1, operation of controlling the voltage of the high voltage output terminal 209 is determined only by the current values of the current control units 203a and 203b, and thus does not depend on the reference voltage of floating. Therefore, the voltage of the high voltage output terminal 209 can be controlled using the reference control signal 106 in the same manner as in Embodiment 1.

As described above, in the high-voltage power supply of Embodiment 2, it is possible to configure the high-voltage amplifier only with N-type active elements, which generally have a high breakage voltage, and it is possible to handle a higher voltage.

Embodiment 3

In Embodiments 1 and 2, a maximum voltage that can be handled is determined by maximum breakage voltages of the active elements 204a, 204b, 301 and the resistant element Bs 207a and 207a. In Embodiment 3, a higher voltage can be handled by connecting a plurality of active elements and resistant element Bs in multiple stages.

The high-voltage amplifier 103 of Embodiment 3 will be described with reference to FIG. 4.

The high-voltage amplifier 103 includes the feedback control unit 201, the voltage-resistant elements 202a and 202b, the current control units 203a and 203b, active element groups 401a and 401b, the semiconductor elements 205a and 205b, the resistant element As 206a and 206b, resistant element B groups 402a and 402b, the voltage dividing unit 208, and the high-voltage output terminal 209.

Here, the active element groups 401a and 401b are configured with a multi-stage connection of a plurality of active elements, for example, a multistage connection of N-type MOSFETs. Further, the resistant element B groups 402a and 402b have a configuration in which a plurality of high voltage resistance elements are connected in multiple stages.

The active element group 401a is connected between the positive high voltage and the current control unit 203a, and the resistant element B group 402a is connected between the positive high voltage and the resistant element A 206a. The numbers of elements constituting the active element group 401a and the resistant element group 402a are the same, and control terminals of active elements (for example, gate terminals of the MOSFETs) in the active element group 401a and nodes between resistance elements (connection points) in the resistant element B group 402a are connected respectively. Similarly, the active element group 401b is connected between the high voltage output terminal 209 and the current control unit 203b, and the resistant element B group 402b is connected between the high voltage output terminal 209 and the resistant element A 206b.

The numbers of elements constituting the active element group 401b and the resistant element group 402b are the same, and control terminals of active elements in the active element group 401b and nodes between resistance elements in the resistant element B group 402b are connected respectively. With such a configuration, the active element groups 401a and 401b each operate in the same manner as one active element, and the resistant element B groups 402a and 402b each operate in the same manner as one resistance element B. That is, the voltage of the high voltage output terminal 209 can be controlled by the same operation as that of the second embodiment. Here, when the active element groups 401a and 401b and the resistant element B groups 402a and 402b are each configured with N elements, a voltage applied to one active element and one resistant element B can be decreased to 1/N.

As described above, in the high-voltage power supply of Embodiment 3, it is possible to obtain a breakage voltage of N times the breakage voltage of single active element and resistant element B, and it is possible to handle a higher voltage.

Embodiment 4

Embodiment 4 is a mode in which the high-voltage power supplies 100 of Embodiment 1 to 3 are applied to a mass spectrometer. The mass spectrometer according to Embodiment 4 will be described with reference to FIG. 5.

The mass spectrometer is exemplified by a device for analyzing a sample solution eluted from a liquid chromatograph, and includes a device control unit 1, a first high-voltage power supply 2, a second high-voltage power supply 3, a third high-voltage power supply 4, a sample ionization unit 5, a mass filter unit 6, and an ion detection unit 14. Here, the sample ionization unit 5 includes an ion source 15. The ion detection unit 14 includes a conversion dynode 7, a scintillator, and a photoelectron detector 9.

Operations of the mass spectrometer will be described with reference to FIG. 5.

The sample solution for analysis ionizes sample atoms or molecules in the sample ionization unit 5. At this time, a high voltage (generally about several kV) of different polarities according to the polarity of ions to be generated is supplied from the first high voltage power supply 2. Ion molecules 10 generated by ionization are sent to the mass filter unit 6. In the mass filter unit 6, a voltage obtained by superimposing a high frequency voltage and a DC voltage is applied, only ions having a predetermined mass number pass due to an electric field formed by the voltage, and selected ion molecules 11 pass through.

A voltage from the second high-voltage power supply 3 is supplied to the subsequent conversion dynode 7. A high voltage (generally about 10 kV) having a polarity opposite to that of the ion molecules 11 to be analyzed is applied, and the ion molecules 11 attracted by the electric field contact the conversion dynode 7 to knock out secondary electrons 12.

The emitted secondary electrons 12 proceed in a direction toward the scintillator 8 supplied with a high voltage (generally about 10 kV) from the third high-voltage power supply 4, and provide energy to the scintillator 8.

Photons 13 are generated in the scintillator 8 and amplified by the photoelectron detector 9, and a detection signal corresponding to the number of entering secondary electrons 12, that is, the number of ions reaching the conversion dynode 7, is first extracted. In accordance with the polarity of the ions to be analyzed, the device control unit 1 transmits a control signal of a polarity and a voltage value of a high voltage to be output to each of the first, second and third high-voltage power supplies 2, 3, and 4.

In general, the sample ionization unit 5, the conversion dynode 7, and the scintillator 8 are capacitive loads of several tens of pF to several hundred pF. Since the first, second and third high-voltage power supplies 2, 3, and 4 can switch the voltage of about 10 kV at a high rate, for example, analysis on positive ion detection and negative ion detection can be alternately repeated in a short time. That is, a period in which ions cannot be detected is shortened, and a good mass chromatogram or ion chromatogram can be formed.

Further, as shown in FIG. 5, a plurality of high-voltage power supplies are required to be mounted on a mass spectrometer. That is, by realizing a low-cost and compact high-voltage power supply, it is possible to further contribute to reduction of cost and size of a mass spectrometer.

REFERENCE SIGN LIST

100 High-voltage power supply
101 Controller
102 Control signal
103 High-voltage amplifier
104 Positive DC high voltage generator
105 Negative DC high voltage generator
106 Reference control signal
107 Load
201 Feedback control unit
202a, b Voltage-resistant element
203a, b Current control unit
204a, b Active element
205a, b Semiconductor element
206a, b Resistance element A
207a, b Resistance element B
208 Voltage dividing unit
209 High-voltage output terminal
210 Control signal of voltage-resistant element
211 Control signal of current control unit
212 High-voltage drive current
213 Feedback signal
220a Drive unit
220b Reverse drive unit
301 Active element
401a, b Active element group
402a, b Resistance element B group
1 Device control unit
2 First high-voltage power supply
3 Second high-voltage power supply
4 Third high-voltage power supply
5 Sample ionization unit
6 Mass filter unit
7 Conversion dynode
8 Scintillator
9 Photoelectron detector
10 Ion molecule 10
11 Ion molecule after selection 12 Secondary electron
13 Photon
14 Ion detection unit
15 Ion source

The invention claimed is:

1. A high-voltage amplifier comprising a drive unit, wherein
the drive unit includes:
a first current control unit including a first terminal and a second terminal;
a first active element including a current inflow terminal, a current outflow terminal, and a control terminal;
a semiconductor element including a first terminal and a second terminal;
a first resistance element including a first terminal and a second terminal; and
a second resistance element connected to the first resistance element,
the first terminal of the first current control unit is connected to a positive high voltage, the first terminal of the semiconductor element, and the first terminal of the first resistance element,
the current inflow terminal of the first active element is connected to the second terminal of the first current control unit,
the second terminal of the semiconductor element and the second terminal of the first resistance element are connected to the control terminal of the first active element,
the second resistance element is connected between the current outflow terminal and the control terminal of the first active element, and
the first current control unit is configured to cause a drive current corresponding to an input signal to flow into the first active element, and cause a drive current output from the first active element to flow into a load, so as to generate an output voltage.

2. The high-voltage amplifier according to claim 1, further comprising:
a reverse drive unit, wherein
the reverse drive unit includes:
a second current control unit connected to a negative high voltage;
a second active element having a current polarity reversed from that of the first active element;
a third resistance element; and
a fourth resistance element connected to the third resistance element, and
the first and second current control units are configured to cause the drive current output from the first active element to flow into the third resistance element and the fourth resistance element of the reverse drive unit.

3. The high-voltage amplifier according to claim 1, further comprising:
a second current control unit connected to a negative high voltage;
a second active element connected between the first current control unit and the second current control unit;
a third resistance element; and
a fourth resistance element connected to the third resistance element,
the second active element has the same current polarity as that of the first active element.

4. The high-voltage amplifier according to claim 3, wherein
the first active element and the second active element are respectively provided in plurality, and
the first resistance element and the third resistance element are respectively provided in plurality.

5. The high-voltage amplifier according to claim 4, wherein
the number of the plurality of first active elements and the number of the plurality of first resistance elements are the same, and
the number of the plurality of second active elements and the number of the plurality of third resistance elements are the same.

6. The high-voltage amplifier according to claim 5, wherein
the control terminals of the first active elements are respectively connected to nodes between adjacent ones of the first resistance elements, and
the control terminals of the second active elements are respectively connected to nodes between adjacent ones of the third resistance elements.

7. The high-voltage amplifier according to claim 1, further comprising:
a voltage-resistant element configured to apply a control signal to the first current control unit;
a feedback control unit configured to apply a control signal to the voltage-resistant element; and
a voltage dividing unit configured to apply a feedback signal to the feedback control unit.

8. A high-voltage power supply, further comprising:
a controller configured to apply a reference control signal to the high-voltage amplifier according to claim 1; and
a positive high voltage generator configured to generate the positive high voltage.

9. A mass spectrometer configured to analyze a sample solution eluted from a liquid chromatograph, the mass spectrometer comprising:
a sample ionization unit including an ion source; and
an ion detection unit including a conversion dynode and a scintillator, wherein
the high-voltage power supply according to claim 8 is connected to at least one of the ion source, the conversion dynode, and the scintillator.

10. The mass spectrometer according to claim 9, wherein the ion source, the conversion dynode, and the scintillator constitute the load into which the drive current flows is to flow.

11. The mass spectrometer according to claim 9, configured to switch a polarity or a voltage value of the output voltage by the high-voltage power supply according to a polarity of ions to be analyzed.

* * * * *